United States Patent [19]

Pickton et al.

[11] 4,037,164

[45] July 19, 1977

[54] EXPONENTIAL DECAY WAVE FORM GENERATOR AND METHOD

[75] Inventors: Shailer T. Pickton, Lafayette; Gordon B. Dean, Martinez, both of Calif.

[73] Assignee: Systron Donner Corporation, Concord, Mass.

[21] Appl. No.: 659,139

[22] Filed: Feb. 18, 1976

[51] Int. Cl.² .............................................. H03K 4/04
[52] U.S. Cl. ................................... 328/187; 328/144; 331/106; 332/37 R; 84/1.13
[58] Field of Search ............... 328/142, 144, 145, 223, 328/178–187; 331/106; 332/37 R; 84/1.13, 1.26

[56] References Cited

U.S. PATENT DOCUMENTS

| | | | |
|---|---|---|---|
| 3,201,707 | 8/1965 | Aucremanne et al. | 331/106 X |
| 3,502,987 | 3/1970 | Newton | 332/37 R |
| 3,636,801 | 1/1972 | Ichikawa | 84/1.13 |
| 3,846,645 | 11/1974 | Kim et al. | 328/187 |

*Primary Examiner*—John S. Heyman

*Attorney, Agent, or Firm*—Flehr, Hohbach, Test, Albritton & Herbert

[57] ABSTRACT

A command signal is provided through a buffer amplifier to an exponential signal generator which provides an exponential signal envelope at the output thereof. The exponential signal envelope is coupled to an inverting unity gain amplifier for providing an inverse exponential signal envelope. The exponential and inverse exponential signal envelopes are coupled to an astable element which provides an output frequency having an amplitude related to the exponential signal envelopes. Means are included in the exponential signal generator for providing a predetermined decay time for the exponential signal envelopes. Means are included in the astable element for providing a predetermined frequency at the output of the astable element. Means are also included in the astable element for providing a common assymptote for the exponential and inverse exponential signal envelopes.

22 Claims, 6 Drawing Figures

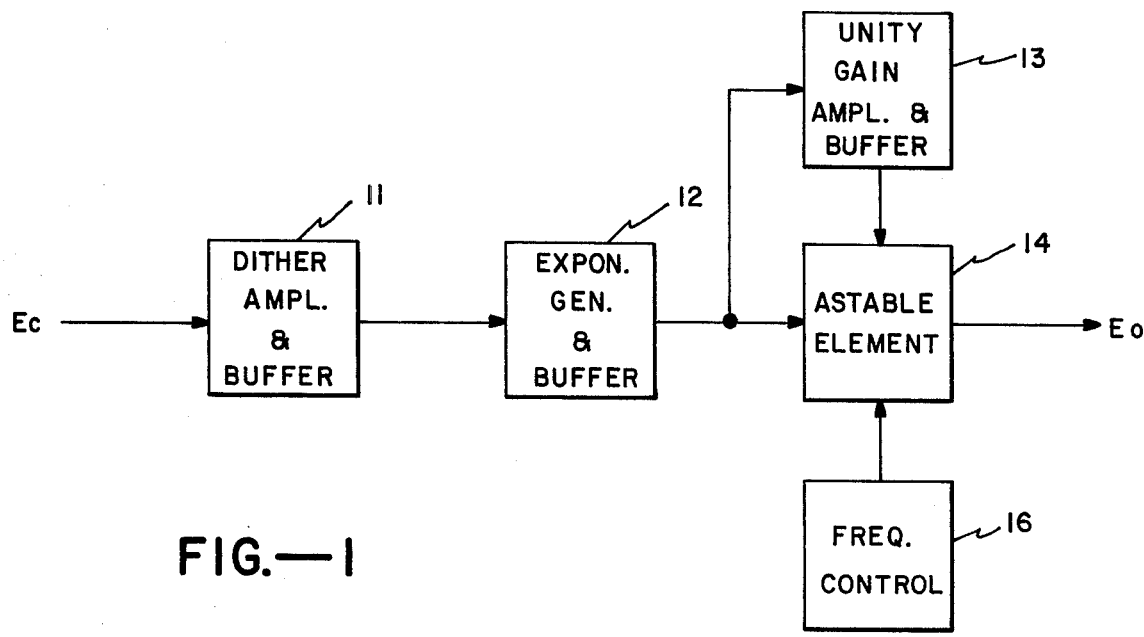
FIG.—1
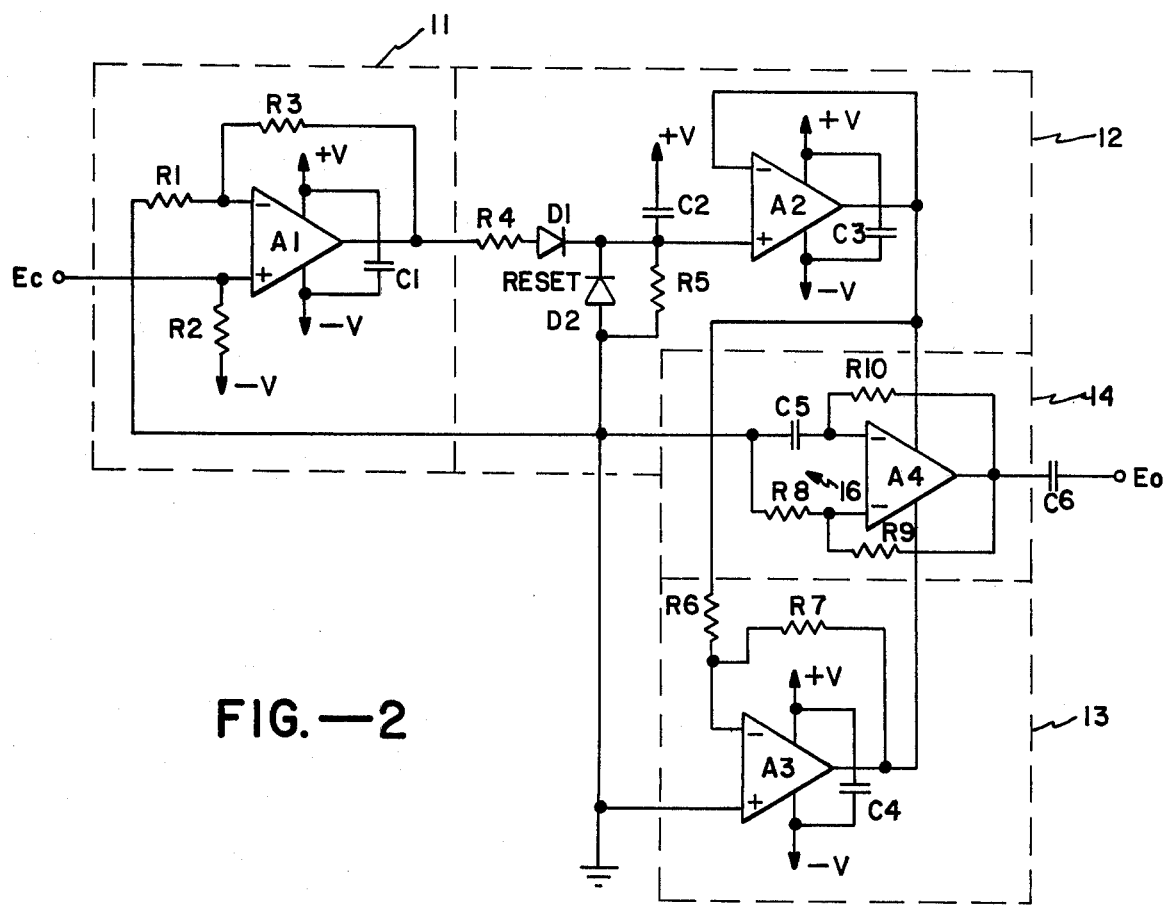
FIG.—2

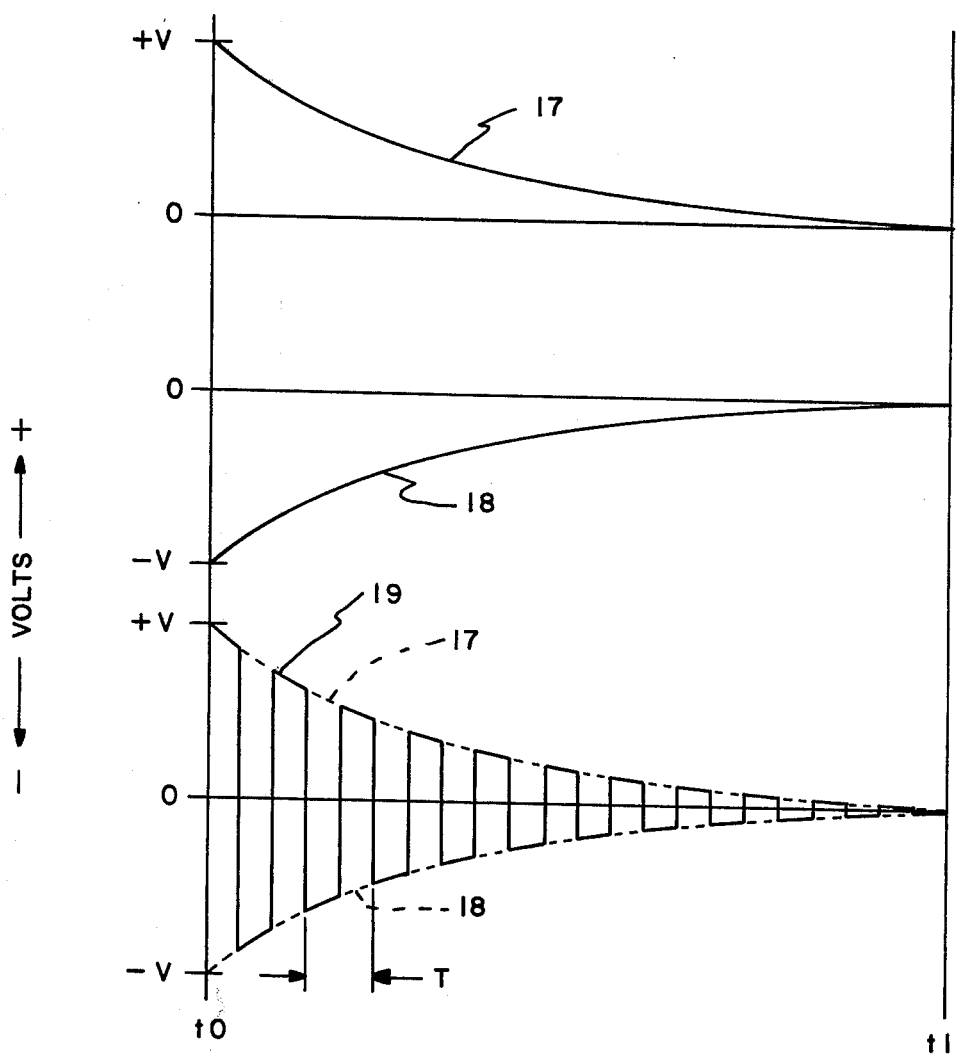
FIG.—3

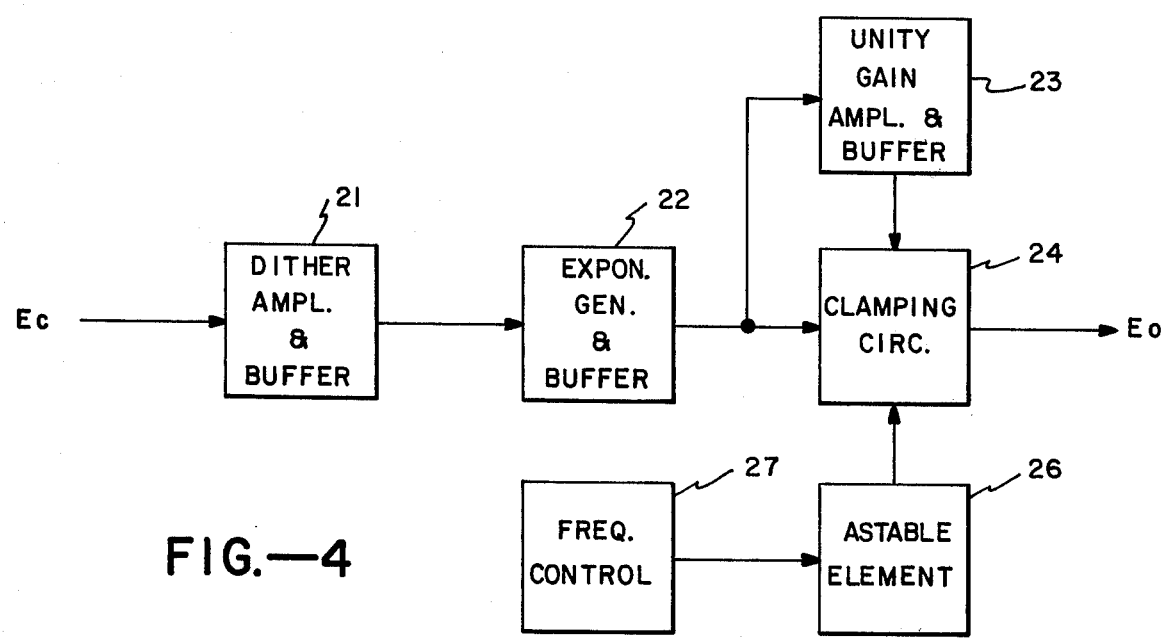
FIG.—4
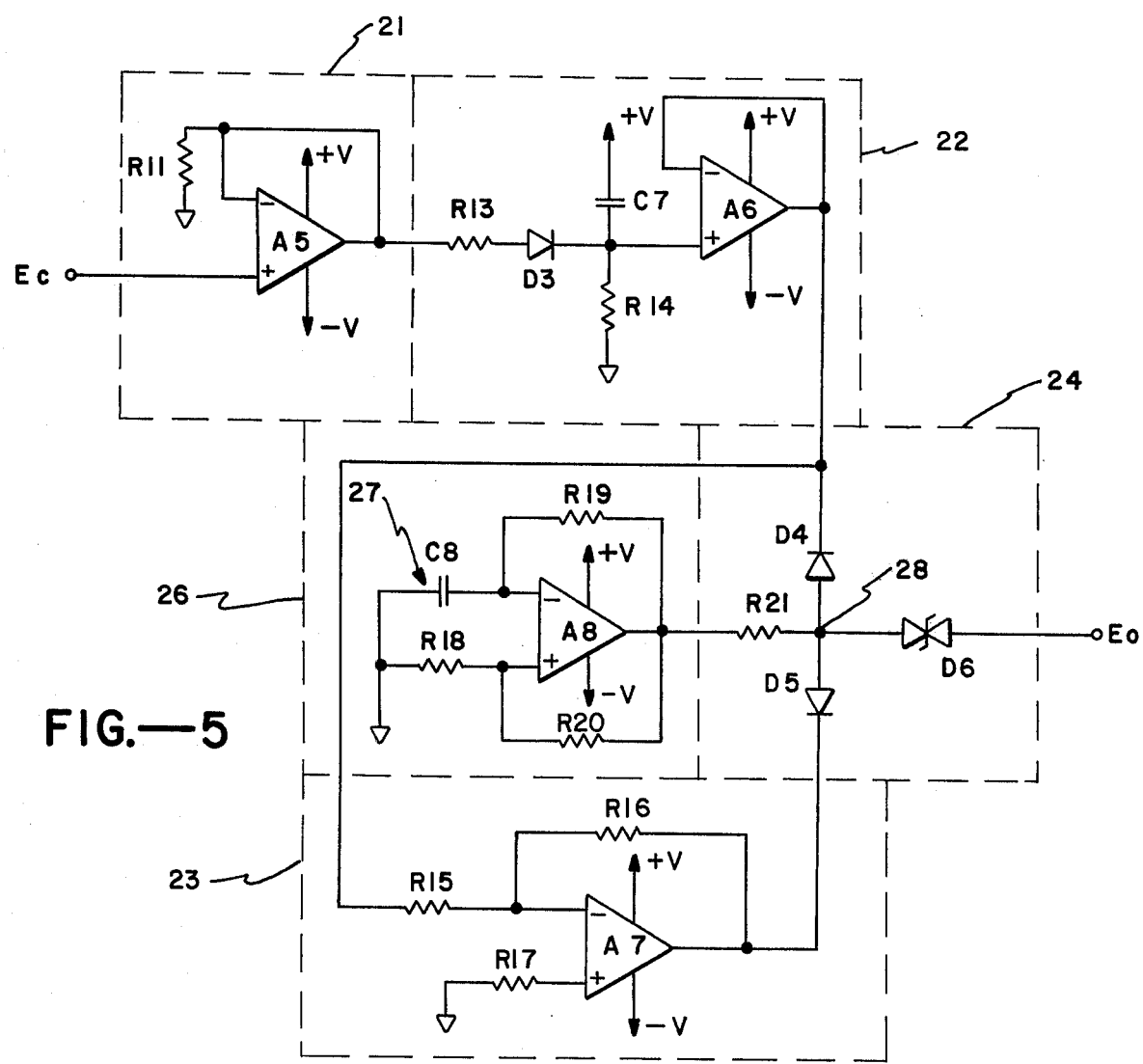
FIG.—5

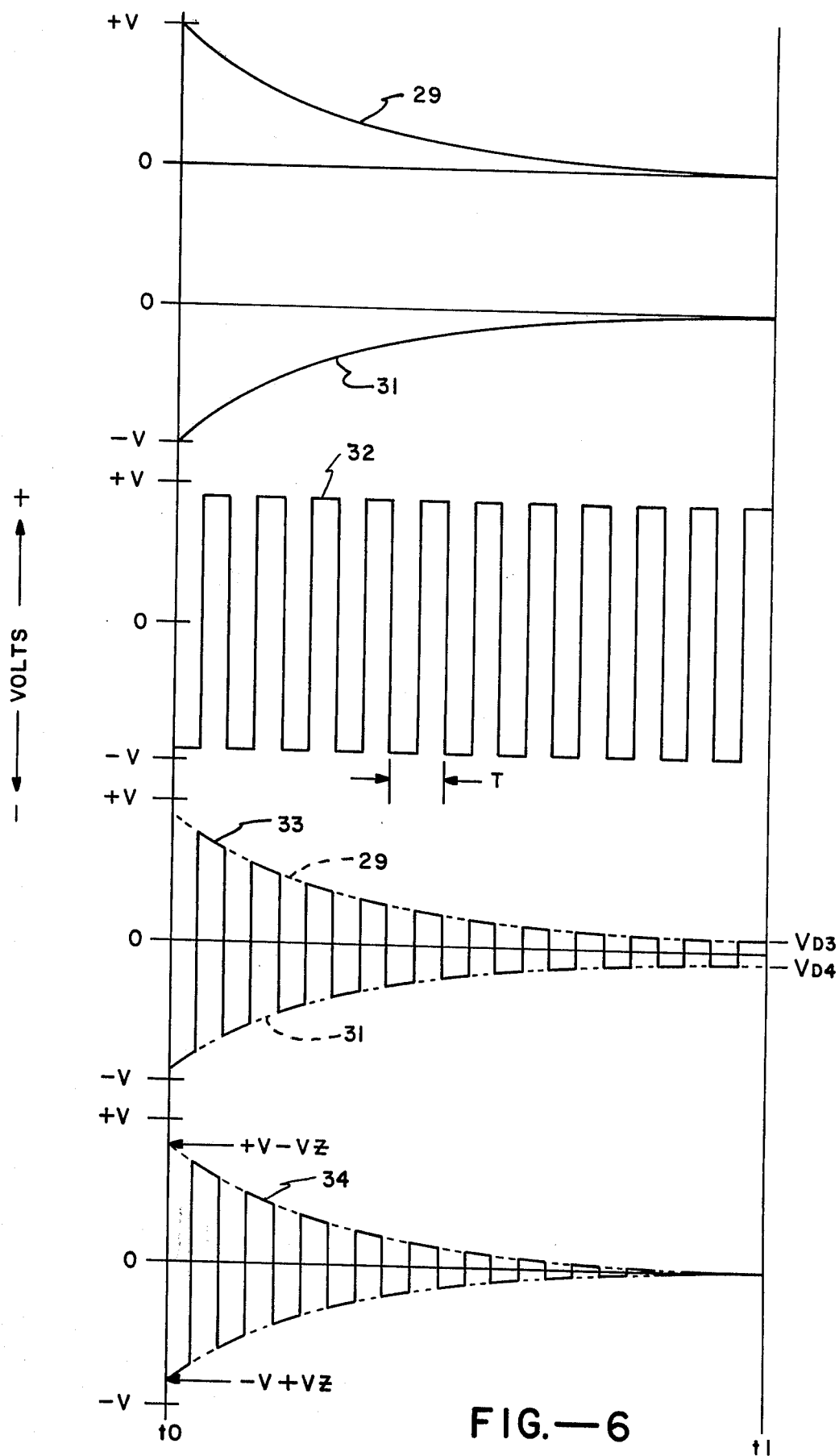
FIG.—6

EXPONENTIAL DECAY WAVE FORM GENERATOR AND METHOD

BACKGROUND OF THE INVENTION

This invention relates to a circuit for providing an alternating output signal in response to an input command signal and more particularly to such a circuit for providing an output signal having a predetermined frequency and amplitude decay time.

Frequently it is advantageous to obtain an oscillatory signal for a predetermined period of time for application to a driver for a mechanical system to remove static friction present in mechanical systems when such systems are initially actuated. Such circuits are commonly termed "dithering" circuits because of their function which is to "dither" the mechanical system immediately after actuation to remove static friction as mentioned above. Prior circuits used for this purpose have exhibited either large volume or large or continuous power drain characteristics or some combination thereof. The "dithering" circuit is desired for reducing both circuit volume and power drain, so that such circuits may be utilized with subminiature electromechanical transducers.

SUMMARY AND OBJECTS OF THE INVENTION

The disclosed circuitry provides a wave form generator which responds to a command signal applied at the input of a buffer amplifier. The buffer amplifier provides an output to a circuit which performs as an exponential signal generator producing an exponential signal envelope. An inverter receives the exponential signal envelope and provides a reverse polarity exponential signal envelope. The exponential and reverse polarity exponential signal envelopes are coupled to an astable element having frequency determinative circuit components associated therewith. The astable element provides an output frequency having an amplitude which is shaped by the exponential and reverse polarity exponential envelopes to assume an exponentially decaying characteristic in accordance therewith.

In general, it is an object of the present invention to provide an exponentially decaying amplitude in an alternating signal for driving a mechanical member in an oscillatory mode.

Another object of the invention is to provide an exponentially decaying alternating signal on command.

Another object of the invention is to provide an exponentially decaying signal at initial application of power to the circuit.

Another object of the present invention is to provide an exponentially decaying signal in a circuit of minimal volume and which consumes minimal power in a standby mode.

Another object of the invention is to provide an exponentially decaying oscillatory signal wherein the decay time and oscillatory frequency may be set to predetermined values.

Additional objects and features of the invention will appear from the following description in which the preferred embodiment has been set forth in detail in conjunction with the accompanying drawings.

BRIEF DESCRIPTION OF THE DRAWINGS

FIG. 1 is a block diagram showing one embodiment of the exponential decay wave form generator.

FIG. 2 is an electrical schematic diagram of the embodiment of FIG. 1.

FIG. 3 is a timing diagram showing signals obtained in the circuit of FIG. 2.

FIG. 4 is a block diagram of another embodiment of the exponential decay wave form generator.

FIG. 5 is an electrical schematic diagram of the embodiment of FIG. 4.

FIG. 6 is a timing diagram of signals obtained in the electrical circuit of FIG. 5.

DESCRIPTION OF THE PREFERRED EMBODIMENTS

The block diagram of FIG. 1 shows a "dither" amplifier and buffer 11 which is configured to receive a command signal $E_C$. Amplifier 11 provides an output responsive to the command signal $E_C$ which is coupled to an exponential generator and buffer 12. Exponential generator 12 produces an output which decays exponentially in a decay time period. The exponentially decaying output from generator 12 is coupled to a unity gain amplifier and buffer 13 which produces an output having reverse polarity compared to the exponentially decaying input signal, being similar thereto in all aspects except for the reverse polarity. The exponentially decaying and reverse polarity exponentially decaying signals are coupled to an astable element 14 which has associated therewith a frequency control 16. The astable element 14 thereby produces an oscillatory output having an amplitude which decays in accordance with the exponentially decaying and reverse polarity exponentially decaying signals. Exponential signal generator 12 includes means for adjusting the decay time of the exponential signals and frequency control 16 includes means for adjusting the frequency of the output $E_O$ from astable element 14.

Turning to FIG. 2, one circuit for achieving the embodiment of FIG. 1 is shown including four operational amplifiers (op-amps) A1 through A4. Op-amp A1 is included in dither amplifier and buffer 11 receiving the command signal $E_C$ at the positive input thereto and providing an output therefrom. Exponential signal generator and buffer 12 includes capacitor C2 and resistor R5 for generating the exponential wave form. The output from op-amp A1 is coupled to the node between C2 and R5 through isolation elements R4 and D1. Diode D2 is shown for resetting the exponential wave form generator shown as C2 and R5 in FIG. 2. A momentary power interruption will discharge capacitor C2 substantially immediately, bypassing resistor R5, so that redithering will occur when power is reapplied. A signal having an exponentially decaying envelope is obtained from the exponential wave form generator in response to command signal $E_C$, and the exponentially decaying signal is connected to the positive input of op-amp A2. Op-amp A2 provides an exponentially decaying output signal which is connected to the negative input of op-amp A3 for providing an output having a polarity which is the inverse of the exponential signal at the output of op-amp A2. The exponential and inverse exponential signals are connected to the control input of op-amp A4 providing positive and negative exponentially decaying signal envelopes for controlling the amplitude of the oscillatory signal at the output of op-amp A4 in accordance therewith.

The decay time for the signal for exponential generator 12, and therefore for the inverse exponential signal from op-amp A3 is subject to adjustment by proper selection of one or both of the values of capacitor C2 and resistor R5. The output frequency from op-amp A4 in astable element 14 is subject to adjustment to a predetermined output frequency by proper selection of the capacitor C5 and resistor R8 in frequency control 16. In this fashion, the exponentially decaying output $E_O$ is set to appear over a predetermined decay time and at a predetermined frequency.

Turning to FIG. 3 the output from op-amp A2 is shown as signal envelope 17, and the output fom op-amp A3 is shown as signal envelope 18. Op-amp A4 is driven by exponential signals 17 and 18 in the embodiment of FIG. 2 producing the oscillatory output 19 having a period T as shown and a decaying amplitude envelope as determined by the exponential and inverse exponential signals 17 and 18 respectively. It should be noted that in this embodiment the output frequency from astable element 26 continues at full amplitude as long as input command $E_C$ exists. The exponential decay begins at $t_O$ in FIG. 3 on the release of $E_C$.

Another embodiment of the disclosed invention is seen in FIG. 4 in block form where a "dither" amplifier and buffer 21 is shown receiving command signal $E_C$. An exponential wave form generator and buffer 22 is shown receiving the buffered command signal from dither amplifier 21 and providing an exponentially decaying signal at the output thereof. The exponentially decaying signal is coupled to the input of a unity gain amplifier and buffer 23 for providing a reverse polarity exponentially decaying signal relative to the output from exponential generator 22. The exponential and reverse polarity exponential signals are coupled to a clamping circuit 24 which also receives an oscillatory output provided by an astable element 26. The oscillatory output from astable element 26 is determined in frequency by a frequency control 27. Clamping circuit 24 provides an output $E_O$ having a predetermined frequency with amplitude exponentially decaying in accordance with the exponential and reverse polarity exponential signals.

FIG. 5 is a schematic diagram of the embodiment of FIG. 4 showing four op-amps A5 through A8. Op-amp A5 receives a "dither" command signal $E_C$ at the positive input thereto and provides a buffered output through isolation elements R13 and D3 to an exponential signal generating circuit including capacitor C7 and resistor R14. An exponentially decaying signal is provided by the C7/R14 combination which is connected to the positive input of op-amp A6. A buffered exponentially decaying signal is thereby presented at the output of op-amp A6 which is in turn presented to the negative input of op-amp A7 for obtaining a reverse polarity exponentially decaying signal relative to the output of op-amp A6. Op-amp A8 in FIG. 5 provides a continuous output frequency having a period determined by the frequency control 27 shown as the combination of capacitor C8 and resistor R18. An exponentially decaying output is presented at junction 28 having an amplitude equivalent to the voltage drop across diodes D4 and D5. Double zener diode D6 is provided to reduce the voltage at junction 28 by the voltage drop thereacross to thereby present an exponentially decaying output frequency at $E_O$ in which both the positive and negative exponential envelopes approach a common assymptote. Thus, while astable element 26 continues to produce an oscillatory output, the residual oscillatory output at junction 28 is compensated by double zener D6 and is therefore not present in the circuit output $E_O$.

FIG. 6 is a timing diagram of some of the signals in the electrical schematic of FIG. 5. A positive exponentially decaying signal envelope 29 is shown as the output from op-amp A6. A negative exponentially decaying signal envelope is shown at 31 as the output from op-amp A7. A continuing output frequency signal 32 is present at the output of op-amp A8. An exponentially decaying output frequency 33 is seen at junction 28 having residual positive and negative amplitudes $V_{D3}$ and $V_{D4}$ respectively. A compensated exponentially decaying output frequency signal 34 is shown wherein the residual oscillatory frequency in exponentially decaying signal 33 is removed by the voltage drops across double zener diode D6. As mentioned above, in connection with the embodiment of FIG. 2, exponential decay time $t_1 - t_O$ may be set to a predetermined value by proper selection of either or both capacitor C7 and resistor R14. The continuous output frequency 32 may be set to assume a predetermined period T, or output frequency, by proper selection of either or both capacitor C8 and resistor R18.

The embodiment of the exponential decay wave form generator of FIG. 2 utilizes the exponential and inverse exponential signals as the power source for the astable element. This embodiment provides a small volume circuit in which the dither frequency and dwell time are independently adjustable to meet the requirements of any mechanical moving system to which the dithering signal $E_O$ may be applied. In such systems it is often advantageous to apply the dithering signal at initial power turn-on to immediately remove the affects of static friction in the moving system supports. The embodiment of FIG. 5 has the same utility as that of FIG. 2, but requires slightly less volume for the entire circuit. Dither output frequency and dwell time are again independently adjustable and the dither signal is automatically provided when power is applied initially to the circuit. In both of the circuits of FIG. 2 and 5, a four operational amplifier microcircuit package may be utilized.

What is claimed is:

1. A wave form generator responsive to an input command signal, comprising an input amplifier having a high input impedance, and a low output impedance, for receiving the input command signal at the input thereof and providing an output therefrom, an exponential signal generator coupled to said output from said input amplifier and producing an exponential signal envelope at the output thereof, means coupled to said exponential signal generator output and providing a reverse polarity exponential signal envelope at the output thereof, an astable element coupled to receive said exponential and inverse exponential signal envelopes providing an exponentially decaying alternating output at a predetermined frequency at the output thereof.

2. A wave form generator as in claim 1 wherein said exponential signal generator is a series capacitance resistance network and said output from said input amplifier is coupled to the junction therebetween.

3. A wave form generator as in claim 1 wherein said exponential signal generator includes means for shaping said exponential decay envelope to provide a predetermined exponential decay period.

4. A wave form generator as in claim 1 together with means for setting said predetermined frequency.

5. A wave form generator responsive to a command signal, comprising an exponential signal generator coupled to receive said command signal and providing an exponential signal envelope having a predetermined decay time at the output thereof, means for receiving and inverting said exponential signal envelope providing a reverse polarity exponential signal envelope, an astable element coupled to receive said exponential and reverse polarity exponential signal envelopes and producing a signal at an output frequency, means for setting said output frequency to a predetermined frequency, said exponential signal envelopes operating to provide an exponentially decaying output at said predetermined output frequency.

6. A wave form generator as in claim 5 together with means for setting said predetermined decay time.

7. A wave form generator as in claim 5 wherein said astable element includes a clamping circuit wherein said exponential and reverse polarity exponential envelopes are received, said clamping circuit operating to provide a common assymptote for said exponential envelopes.

8. A wave form generator providing an exponentially decaying alternating polarity signal having a predetermined frequency and a predetermined decay time responsive to a command signal, comprising an exponential signal generator coupled to receive the command signal and providing an exponential signal at the output thereof, means for isolating the command signal from said exponential signal generator, means coupled to receive and invert said exponential signal providing a reverse polarity exponential signal, an astable element coupled to receive said exponential and reverse polarity exponential signals, means for providing an output frequency from said astable element, said exponential and reverse polarity exponential signals operating to shape the amplitude of said output frequency in accordance with said exponential and reverse polarity exponential signals within the predetermined decay time.

9. A wave form generator as in claim 8 together with means for setting said predetermined decay time.

10. A wave form generator as in claim 8 wherein said astable element includes a clamping circuit wherein said exponential and reverse polarity exponential signals are received, said clamping circuit operating to provide a common assymptote for said exponential signals.

11. A wave form generator responsive to a command signal applied thereto, comprising buffering means for receiving the command signal and providing a buffered command signal, an exponential signal generator for receiving said buffered command signal providing an exponential signal having a decay time, means coupled to receive said exponential signal and providing an inverse exponential signal, means for receiving said exponential and inverse exponential signals and providing an output frequency therefrom having an amplitude shaped by said exponential and reverse exponential signals.

12. A wave form generator as in claim 11 wherein said means for receiving said exponential and inverse exponential signals includes a clamping circuit for providing a common assymptote for said exponential and inverse exponential signals.

13. A wave form generator as in claim 11 wherein said means for receiving said exponential and inverse exponential signals includes means for setting said output frequency to a predetermined frequency.

14. A wave form generator as in claim 11 wherein said exponential generator includes means for setting a predetermined time for said decay time.

15. A wave form generator used in conjunction with a power source and being responsive to an input command signal to produce an output for coupling to a driver for a mechanical system for providing an oscillatory drive torque, comprising means for generating a signal envelope having an exponentially decaying amplitude, said last named means being coupled to receive the input command signal, an astable element providing a continuous oscillatory output means for receiving said continuous oscillatory output and said exponentially decaying signal envelope and providing an oscillatory output having an output amplitude which decays in accordance with said exponentially decaying amplitude, said decaying amplitude having a predetermined decay time and a residual oscillatory frequency amplitude thereafter, and means for coupling said decaying oscillatory output to the driver, said means for coupling including means for substantially removing said residual oscillatory frequency amplitude.

16. A wave form generator used in conjunction with a power source and being responsive to an input command signal to produce an output for coupling to a driver for a mechanical system for providing an oscillatory drive torque, comprising means for generating a signal envelope having an exponentially decaying amplitude, said last named means being coupled to receive the input command signal, an astable element receiving said signal envelope and providing an oscillatory output therefrom, said oscillatory output having an output amplitude which decays in accordance with said exponentially decaying amplitude, said astable element having input terminals and power excitation terminals, said signal envelope being coupled to said power excitation terminals, circuit means for determining a frequency for said oscillatory output, said circuit means being connected to said input terminals and means for coupling said oscillatory output to the driver.

17. A wave form generator used in conjunction with a power source and being responsive to an input command signal to produce an output for coupling to a driver for a mechanical system for providing an oscillatory drive torque, comprising means for generating a signal envelope having an exponentially decaying amplitude, said last named means being coupled to receive the input command signal, and an astable element receiving said signal envelope and providing an oscillatory output therefrom, said oscillatory output having an output amplitude which decays in accordance with said exponentially decaying amplitude, means for coupling said oscillatory output to the drive motor, and means for resetting connected to said means for generating a signal envelope, whereby momentary interruption of the connection to the power source resets said last named means and said oscillatory output is produced thereby.

18. A wave form generator used in conjunction with a power source and being responsive to an input command signal to produce an output for coupling to a driver for a mechanical system for providing an oscillatory drive torque, comprising means for generating a signal envelope having an exponentially decaying amplitude, said last named means being coupled to receive the input command signal, and an astable element receiving said signal envelope and providing an oscillatory output therefrom, said oscillatory output having an output amplitude which decays in accordance with said exponentially decaying amplitude, and means for coupling said oscillatory output to the drive motor, said means for generating a signal including first circuit means for providing a predetermined decay time, and said astable element including second circuit means for providing a predetermined period for said oscillatory output.

19. A method for providing an oscillatory output signal having a predetermined amplitude envelope comprising the steps of receiving an input command signal, forming an exponentially decaying signal responsive to the input command signal, inverting the exponentially decaying signal, generating an oscillatory signal, and connecting the exponentially decaying and inverted exponentially decaying signals to control the amplitude of the oscillatory signal, whereby the predetermined amplitude envelope decays to a predetermined level in a predetermined decay time.

20. A method as in claim 19 together with the step of reinitiating the exponentially decaying signal when an interruption of power occurs.

21. A method as in claim 19 together with the step of setting the frequency of the oscillatory signal to a predetermined frequency.

22. A method as in claim 19 together with the step of setting the predetermined level to a level so that the exponentially decaying and inverted exponentially decaying envelopes have a common assymptote.

* * * * *